(12) United States Patent
Peretto

(10) Patent No.: US 8,379,364 B2
(45) Date of Patent: Feb. 19, 2013

(54) CONSTRUCTION SYSTEM FOR A CAPACITIVE SENSOR

(75) Inventor: Lorenzo Peretto, Rovigo (IT)

(73) Assignee: Green Seas Ventures, Ldt., Tortola (VG)

( * ) Notice: Subject to any disclaimer, the term of this patent is extended or adjusted under 35 U.S.C. 154(b) by 154 days.

(21) Appl. No.: 13/123,000

(22) PCT Filed: Oct. 1, 2009

(86) PCT No.: PCT/IT2009/000446
§ 371 (c)(1),
(2), (4) Date: Apr. 13, 2011

(87) PCT Pub. No.: WO2010/049964
PCT Pub. Date: May 6, 2010

(65) Prior Publication Data
US 2011/0205683 A1    Aug. 25, 2011

(30) Foreign Application Priority Data
Oct. 30, 2008  (IT) .............................. BO20080079 U

(51) Int. Cl.
*H01G 7/00* (2006.01)
(52) U.S. Cl. ..... 361/281; 361/277; 361/278; 361/283.3; 361/287; 361/292
(58) Field of Classification Search .................. 361/281, 361/277–278, 280, 283.1, 283.3, 287, 290–292; 324/96, 117 R, 753
See application file for complete search history.

(56) References Cited

U.S. PATENT DOCUMENTS

| | | | | |
|---|---|---|---|---|
| 5,155,653 A * | 10/1992 | Kremidas | .................. | 361/283.4 |
| 5,224,383 A * | 7/1993 | Pinto et al. | ...................... | 73/706 |
| 6,127,817 A | 10/2000 | Chartrefou | | |
| 7,141,988 B2 * | 11/2006 | Chertok | ......................... | 324/661 |
| 7,215,529 B2 * | 5/2007 | Rosenau | ....................... | 361/303 |
| 7,420,377 B2 * | 9/2008 | Chertok | ......................... | 324/661 |
| 7,501,834 B2 * | 3/2009 | Madni et al. | .................. | 324/658 |
| 7,539,003 B2 * | 5/2009 | Ray et al. | ...................... | 361/277 |

FOREIGN PATENT DOCUMENTS

| | | |
|---|---|---|
| DE | 76489 B | 9/1892 |
| JP | 5273256 B | 10/1993 |
| WO | 9805974 A | 2/1998 |
| WO | 2006008456 A | 1/2006 |

* cited by examiner

*Primary Examiner* — Nguyen T Ha
(74) *Attorney, Agent, or Firm* — Andrew Wilford

(57) ABSTRACT

A construction system for a capacitive sensor comprises a source electrode (210), a screening element (220) with partition (221) which forms a first and a second screened chamber (220.*a*, 220.*b*), a field sensor (230), a circuit (250), a spacing member (260) with a through-duct, and a screw (270). The partition (221) is provided with a hole (224) and said spacing member (260) is positioned inside the first chamber (220.*a*) with the axis (260.*y*) of the duct arranged coaxial with the axis (224-*y*) of said hole (224). The same spacing member (260) is positioned between the proximal face (223) of the partition (221) and the distal face (232) of the field sensor (230) and said field sensor (230) is provided with a threaded hole (233). The head (271) of the screw (270) is arranged inside the second chamber (220.*b*) and its shank (272) is arranged passing axially through said hole (224) and across said through-duct of said spacing member (260) with its end portion which mates with the threaded hole (233) of said field sensor (230).

17 Claims, 3 Drawing Sheets

CONSTRUCTION SYSTEM FOR A CAPACITIVE SENSOR

CROSS REFERENCE TO RELATED APPLICATIONS

This application is the US national stage of PCT application PCT/IT2999/000446, filed 1 Oct. 2009, published 6 May 2010 as 2010/049964, and claiming the priority of Italian patent application B02008U000079 itself filed 30 Oct. 2008, whose entire disclosures are herewith incorporated by reference.

FIELD OF THE INVENTION

The present invention concerns a construction system for a capacitive sensor and, more particularly, a construction system for fixing in the correct position an electric field sensor inside a capacitive sensor.

BACKGROUND ART

The existing construction systems relating to the sector of capacitive sensors are not suitable for achieving correct positioning of the electric field sensor.

OBJECT OF THE INVENTION

The object of the present invention is to solve the above-mentioned problems.

The invention, as characterized by the claims, solves the problem of creating a construction system for a capacitive sensor which extends along a longitudinal axis defining a proximal portion and a distal portion relative to a bar to which it is connected, said capacitive sensor comprising: —a source electrode arranged in the vicinity of a proximal portion thereof; —an internally hollow screening element which extends along its longitudinal axis, said screening element having a partition intended to configure a first proximal screened chamber and a second distal screened chamber; —an electric field sensor arranged inside said first screened chamber and spaced from the distal end of said source electrode; —a conditioning circuit arranged inside said second screened chamber; —an electric conductor arranged inside said screening element and intended to connect said electric field sensor to said conditioning circuit; said system being characterized in that it comprises a spacing member provided with a through-duct extending axially along its axis and a fixing screw; in that said partition is provided with a hole extending along its axis; in that said spacing member is positioned inside the first chamber with the axis of the through-duct arranged coaxial with the axis of said hole; in that said spacer is positioned between the proximal face of the partition and the distal face of the field sensor; in that said field sensor is provided with a threaded hole on its distal face; in that the head of said screw is arranged inside the second chamber and its shank is arranged so as to pass axially through said hole formed in the partition and across said through-duct of said spacing member; and in that the threaded free end portion of said screw mates with the threaded hole of said field sensor.

BRIEF DESCRIPTION OF THE FIGURES IN THE ACCOMPANYING DRAWINGS

The description which follows of the construction system according to the present invention, in the various practical embodiments, is provided by way of a non-limiting example and moreover with reference to the accompanying figures in which.

DESCRIPTION OF THE PRIOR ART—FIG. 1

Figure 1:
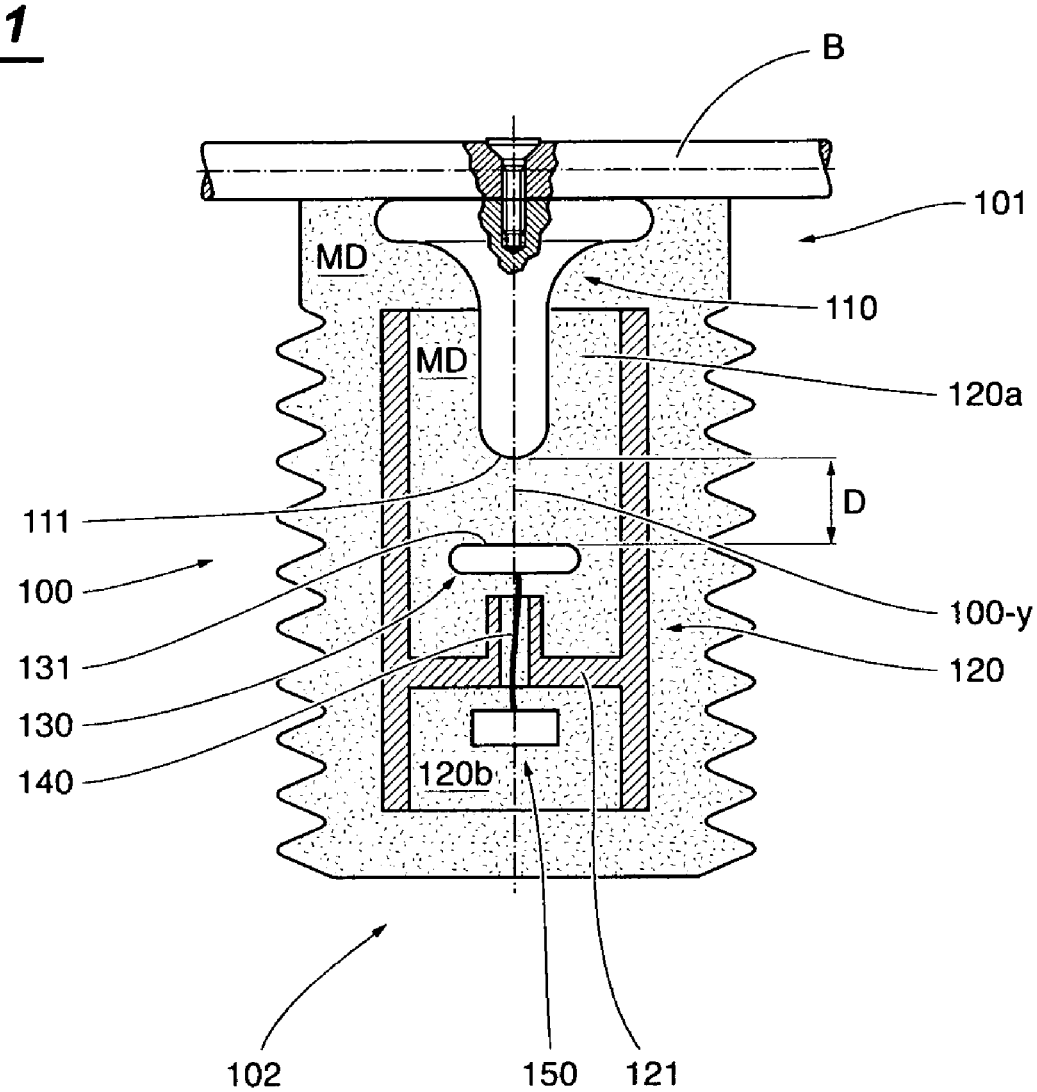
FIG. 1 shows in schematic form a capacitive sensor according to the prior art.

With reference to FIG. 1, according to the prior art, a capacitive sensor, denoted in its entirety by 100, extends along a longitudinal axis 100-Y and comprises a portion thereof, defined as proximal, 101, lying against a voltage bar B, and a distal portion 102.

Said capacitive sensor 100 in brief comprises:
a source electrode 110, having preferably the form of a solid "funnel" connected to the bar B by means of a screw;
a screening element 120 having preferably a cylindrical tubular form and provided with a partition 121 intended to configure a first proximal screened chamber 120a and a second distal screened chamber 120b;
an electric field sensor 130, having preferably a disc-like form, with a proximal face 131 arranged spaced from a distal end 111 of the source electrode 110;
an electric conductor 140;
an electric circuit 150 for conditioning the signal received from the electric field sensor 130;
and, preferably, a mass of dielectric material MD arranged inside said chambers 120a and 120b and also around said screening element 120 so as to form an outer casing having a finned cylindrical form.

With this system, during construction, various problems have arisen with regard to—positioning the proximal face 131 of the electric field sensor 130 at the correct distance D from the end 111 of the source electrode 110 and, more particularly, with regard to positioning and maintaining said distance D during and after the operations for casting and forming the dielectric mass MD inside the chamber 120.a.

Figure 2:
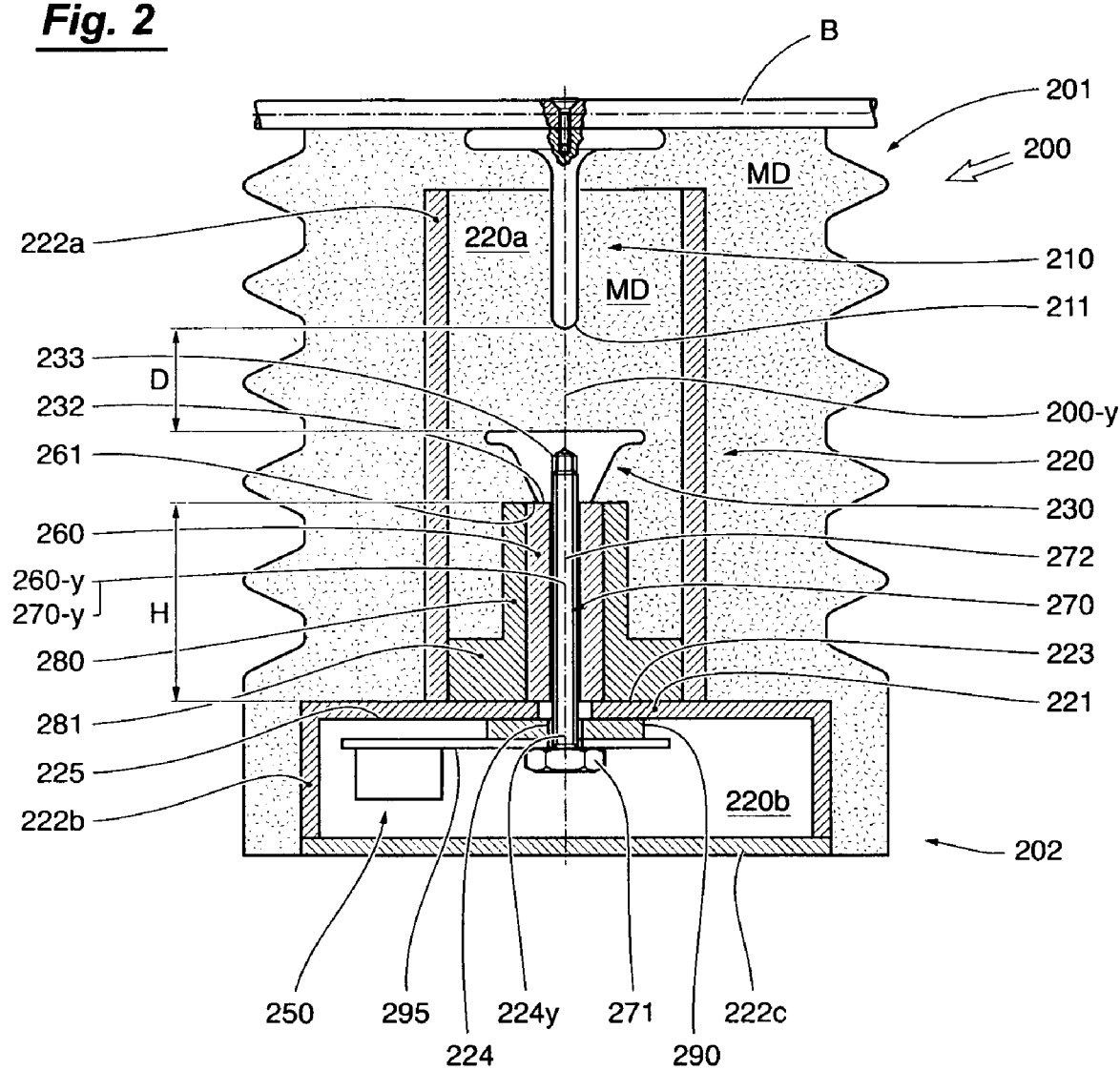
FIG. 2 shows a first practical embodiment of the construction system according to the present invention.
Figure 3:
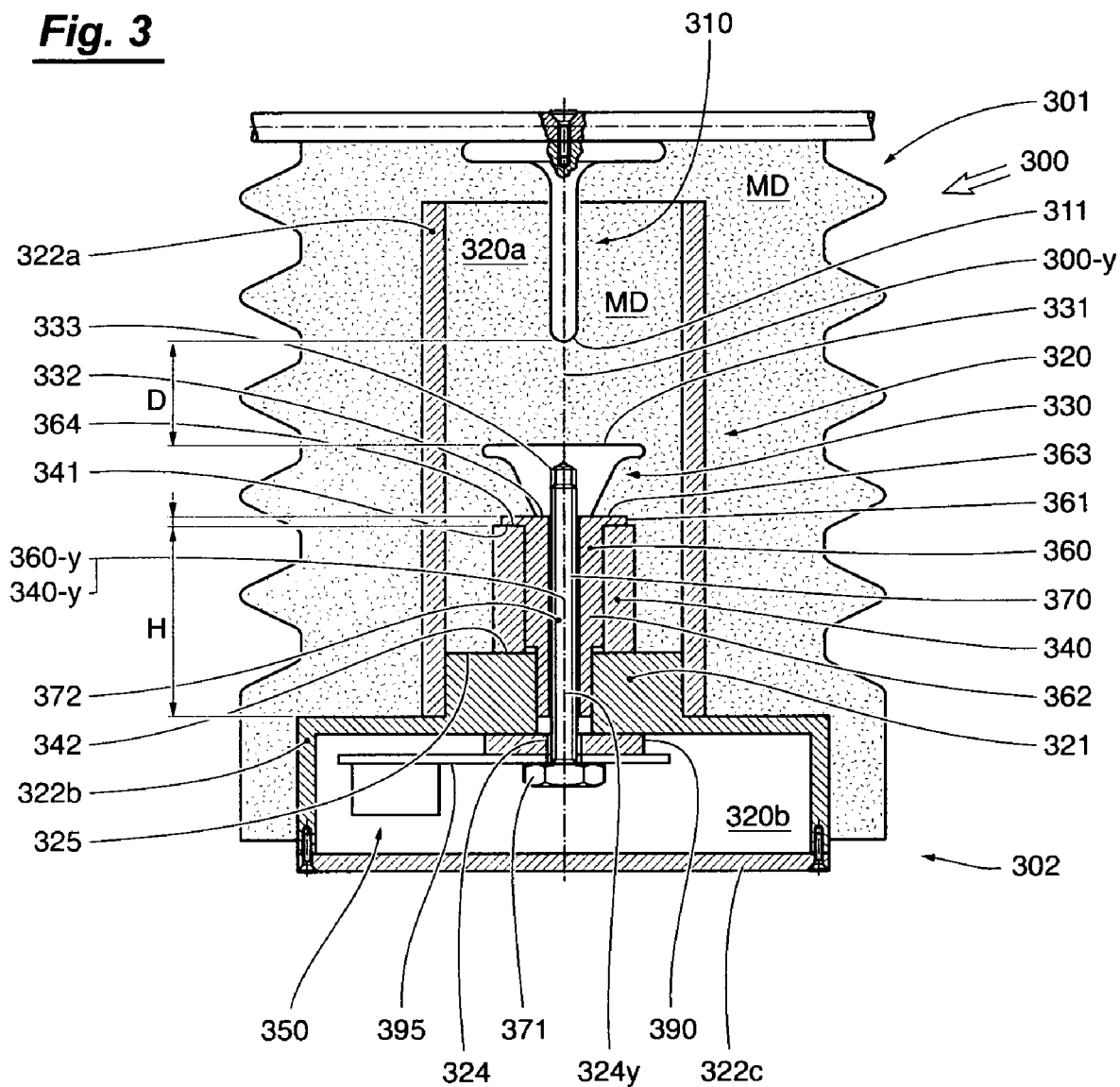
FIG. 3 shows a second practical embodiment of the construction system according to the present invention.

Joint Description of the First and Second Embodiments—FIGS. 2 and 3

As can be understood more clearly from the description which follows of two preferred embodiments, see FIGS. 2 and 3, the construction system according to the present invention is intended to provide a capacitive sensor, 200/300, which extends along a longitudinal axis, 200-Y/300-y, defining a proximal portion and a distal portion relative to a bar B to which it is connected, said capacitive sensor comprising:

a source electrode, 210/310, arranged in the vicinity of a proximal portion thereof;

an internally hollow screening element, 220/320, which extends along its longitudinal axis arranged coaxial with the longitudinal axis of said capacitive sensor, said screening element, 220/320, having a partition, 221/321, intended to configure a first proximal screened chamber, 220.a/320.a, and a second distal screened chamber, 220.b/320.b;

an electric field sensor, 230/330, arranged inside said first screened chamber, 220.a/320.a, and spaced at a distance D from the distal end, 211/311, of said source electrode, 210/310;

a conditioning circuit, 250/350, arranged inside said second screened chamber, 220.b/320.b;

an electric conductor arranged inside said screening element and intended to connect said electric field sensor, 230/330, to said conditioning circuit, 250/350.

More particularly, said construction system comprises a spacing member, 260/360+340, provided with a through-duct extending along its axis, 260-y/360-y, and intended to co-operate with a fixing screw, 270/370, said partition, 221/321, being provided with a through-hole, 224/324, extending axially along its axis, 224-y/324-y.

Said spacing member, 260/360+340, is positioned inside the first chamber, 220.a/320.a, with the axis, 260-y/360-y, of the through-duct arranged coaxial with the axis, 224-y/324-y, of said through-hole, 224/324, formed in the partition, 221/321, and positioned between the proximal face, 223/323, of the partition, 221/321, and the distal face, 232/323, of the field sensor, 230/330.

The field sensor, 230/330, is provided with a threaded hole, 233/333, on its distal face, 232/332.

In order to achieve the desired construction system, the head, 271/371, of the screw, 270/370, is arranged inside the second chamber, 220.b/320.b, and its shank, 272/372, is arranged passing axially through said hole, 224/324, formed in the partition, 221/321, and across said through-duct, 260-y/360-y, of said spacing member, 260/360+340.

Description of the First Embodiment—FIG. 2

With reference to FIG. 2, according to a first embodiment of the construction system according to the present invention, a capacitive sensor, which is denoted here in its entirety by 200, extends along a longitudinal axis 200-Y intended to define, as customarily described, a proximal portion 201 and a distal portion 202 relative to a voltage busbar B.

Said sensor, in a manner similar to the prior art according to FIG. 1, comprises: . . . >—a source electrode 210 arranged in the vicinity of a proximal portion 201 thereof;

an internally hollow screening element 220 which extends along its longitudinal axis arranged coaxial with the axis of said capacitive sensor 200, said screening element 220 having a partition 221 intended to configure a first proximal screened chamber 220.a and a second distal screened chamber 220.b;

an electric field sensor, 230, arranged inside said first screened chamber 220.a;

a conditioning circuit 250 arranged inside said second screened chamber 220.b;

an electric conductor 270, described more fully below, arranged inside said screening element 220 and intended to connect said electric field sensor 230 to said conditioning circuit 250.

With reference to said hollow screening element 220, it comprises three screening elements connected together and made of is conductive material and, more particularly, a first tube-like element 222.a, a second element in the form of an overturned cup 222.b, and a third cover-like element 222.c, the latter being preferably removable, the bottom of said second overturned-cup element 222.b performing the function of the partition 221. Said screening element 220 is connected to a reference potential (for example to the earth potential).

In the proximity of the distal portion 202 of said sensor 200, a first spacing sleeve 260 provided with an axial duct and made of rigid and electrically insulating material is used as spacing member, said spacing sleeve 260, for the reasons which will become clear below, having an outer diameter greater than a hole 224, extending axially along its axis 224-y and formed in the partition 221.

The first spacing sleeve 260 has an axial duct intended to co-operate with a fixing screw 270 which, during assembly, is arranged passing through the axial hole 224 formed in the partition 221 of the screening element 220, said hole 224 and said first spacing sleeve 260 having their respective longitudinal axes of extension, 224-y and 260-y, arranged coaxial with each other.

More particularly, said first spacing sleeve 260 is positioned preferably with its longitudinal axis 260-y arranged coaxial with the axis 200-y of the sensor 200 and arranged between the proximal face 223 of the partition 221 and the distal face 232 of the field sensor 230, while said field sensor, 230, on the said distal face 232 is provided with a threaded axial hole 233 intended to co-operate with the threaded free portion of said screw 270.

With this structure, the head 271 of the screw 270 is arranged inside the second chamber 220.b, its shank 272 arranged passing axially through said hole 224 and through said first spacing sleeve 260 so as to then engage, with its threaded free end, inside the threaded hole 233 of the field sensor 230 so that, by tightening the screw 270, the field sensor 230 is fixed in position, pulling said field sensor 230 against the proximal face 261 of the first spacing sleeve 260 and therefore pulling the same first spacing sleeve 260 against the proximal face 223 of the partition 221.

In this situation, the field sensor 230 is positioned and fixed firmly at the desired distance D from the free end 211 of the source electrode 210, said distance D being determined by the height H of the first sleeve element 260.

Preferably, a second screening sleeve 280, which is made of electrically conductive material, is furthermore provided around said first spacing sleeve 260, a distal portion 281 thereof being fixed and connected to the screening element 220.

Again preferably, it is also possible to envisage further technical and constructional characteristics, such as for example providing between the head 271 of the screw 270 and the distal face 225 of the partition 221 a spacing washer 290 which is made of insulating material and fitted around the shank 272, or providing between the head 271 of the screw 270 and the partition 221 a support plate 295, extending radially from said screw 270, said support plate 295 being intended to house the signal conditioning circuit 250.

Still preferably, said screw 270 and/or said support plate 295 may act as an electric conductor for the connection between said electric field sensor 230 and the circuit 250, but if desirable it is also possible to envisage a conventional conductor, which is preferably screened, for effecting said connection.

With reference to the description given above, if the parts of the sensor 200 are embedded in a mass of dielectric material MD, such as epoxy resin, it is evident that, with the constructional form described above, after assembling and fixing together the various components, it is possible to carry out forming, by means of casting and/or in some other way, of the said dielectric material inside the chamber 220.a and/or around the screening element 200 without the risk of displacing the field sensor 230 which, being thus fixed and constrained, will remain stable in the desired position and at the correct distance D from the source electrode 210.

Description of the Second Embodiment—FIG. 3

With reference to FIG. 3, according to a second embodiment of the construction system according to the present invention, a capacitive sensor, which is denoted here in its entirety by 300, extends along a longitudinal axis 300-Y intended to define, as customarily described, a proximal portion 301 and a distal portion 302 relative to a voltage busbar B.

Said sensor 300, in a manner similar to the prior art according to FIG. 1, comprises:

a source electrode 310 arranged in the vicinity of a proximal portion 301 thereof;

an internally hollow screening element 320 which extends along its longitudinal axis arranged coaxial with the longitudinal axis 300-y of said capacitive sensor 300 and has a partition 321 intended to configure a first proximal screened chamber 320a and a second distal screened chamber 320b;

an electric field sensor, 330, arranged inside said first screened chamber 320a;

a conditioning circuit 350 arranged inside said second screened chamber 320b;

an electric conductor 370, described more fully below, arranged inside said screening element 320 and intended to connect said electric field sensor 330 to said conditioning circuit 350.

With reference to said hollow screening element 320, it comprises three screening elements connected and associated together and, more particularly, a first tube-like element 322.a, a second element in the form of an overturned cup 322.b, and a third cover-like element 322.c, the latter being preferably removable by means of screws, the bottom of said second cup element 322.b performing the function of the partition 321.

In the vicinity of the distal portion 302 of said sensor 300, in order to achieve the desired distance D between the distal end 311 of the source electrode 310 and the proximal face 331 of the electric field sensor 330, the construction system used comprises as spacing member a first spacing sleeve 360 made of rigid insulating material and provided with a flange 361 and a second spacing sleeve 340 made of rigid conductive material, said sleeves being intended to co-operate with a fixing screw 370 arranged so as to pass through an axial hole 324 formed in the partition 321 of the screening element 320, said hole 324, said first spacing sleeve 360 and said second spacing sleeve 340 having their respective longitudinal axes of extension, 324-y, 360-y and 340-y, arranged coaxial with each other.

More particularly, said first spacing sleeve 360 is positioned with the shank 362 directed towards the distal portion 302 and partially inside the hole 324, in order to center and insulate the screw 270 from said hole 324, while the second spacing sleeve 340 is fitted externally around said first spacing sleeve 360, with the distal face 342 of said second spacing sleeve 340 being intended to mate with the proximal face 325 of the partition 321.

The first spacing sleeve 360 has in the vicinity of the flange 361 a distal face 364 in the form of a circular rim which is intended to make mating contact with the proximal face 341 of the second spacing sleeve 340.

The electric field sensor 330 is arranged with its distal face 332 intended to mate with the proximal face 363 of the first spacing sleeve 360 and said distal face 332 is provided with a threaded axial hole 333.

The head 371 of the screw 370 is arranged inside the second chamber 320b and its shank 372 is arranged passing axially through said hole 324 formed in the partition 321 and through said first spacing sleeve 321 so as to then engage, with its free threaded end, inside the threaded hole 333 of the field sensor 330.

With this system, by tightening the screw 370 the field sensor 330 is fixed against the proximal face 363 of the first spacing sleeve 360, the distal face 364, in the form of a circular rim, of the first spacing sleeve 360 is fixed against the proximal face 341 of the second sleeve 340 and, therefore, the second sleeve 340 is fixed against the proximal face 325 of the partition 321.

Preferably, a spacing washer 390 made of insulating material is arranged between the head 371 of the screw 370 and the partition 321.

If desirable, it is possible to arrange, between the head 371 of the screw 370 and the partition 321, a support plate 395 extending radially from said screw 370, said support plate 395 being intended to house the signal conditioning circuit 350, providing preferably the spacing washer 390 between the partition 321 and said support plate 395.

Again preferably, said screw 370 and/or said support plate 395 may act as a conductor for the connection between said electric field sensor 330 and the circuit 350, but, if desirable, it is also possible to envisage a conventional conductor, which is preferably screened, for effecting said connection.

With reference to the description given above, it is possible to envisage embedding the parts of the sensor 300 in a mass of dielectric material MD, such as epoxy resin, and in this respect, it is evident that, with the constructional form described above, after assembling together the various components, it is possible to carry out forming, by means of casting and/or in some other way, of the said dielectric material inside the chamber 320.a and/or around the screening element 320 without the risk of displacing the field sensor 330 which, being thus fixed and constrained, will remain stable in the desired position.

The above description of the construction system for providing a capacitive sensor for detecting an electric field is provided purely by way of a non-limiting example and therefore it is clear that said sensor may be subject to all those modifications and variations arising in practice and/or during its application or use and, in any case, within the scope of the claims which follow.

In this connection, the claims which follow also form an integral part of the above description.

The invention claimed is:

1. A construction system for a capacitive sensor which extends along a longitudinal axis defining a proximal portion and a distal portion relative to a bar to which it is connected, said capacitive sensor comprising:

a source electrode arranged in the vicinity of a proximal portion thereof;

an internally hollow screening element which extends along its longitudinal axis, said screening element having a partition intended to configure a first proximal screened chamber and a second distal screened chamber;

an electric field sensor arranged inside said first screened chamber and spaced from the distal end of said source electrode;

a conditioning circuit arranged inside said second screened chamber;

an electric conductor arranged inside said screening element and intended to connect said electric field sensor to said conditioning circuit; characterized in that it comprises a spacing member provided with a through-duct extending along its axis and a fixing screw; in that said partition is provided with a hole extending axially along its axis; in that said spacing member is positioned inside the first chamber with the axis of the through-duct arranged coaxial with the axis of said hole; in that said spacer is positioned between the proximal face of the partition and the distal face of the field sensor; in that said field sensor is provided with a threaded hole on its distal face; in that the head of said screw is arranged inside the second chamber and its shank is arranged so as to pass axially through said hole formed in the partition and across said through-duct of said spacing member; and in that said threaded free end portion of said screw mates with the threaded hole of said field sensor.

2. The system according to claim 1 wherein said spacing member comprises a first spacing sleeve provided with an axial duct; in that said partition is provided with a hole extending axially along its axis and having a diameter smaller than the greater diameter of said spacing sleeve; in that said first spacing sleeve is positioned inside the first chamber with the axis of the axial duct arranged coaxial with the axis of said hole; in that said first spacing sleeve is positioned between the proximal face of the partition and the distal face of the field sensor; in that said field sensor is provided with a threaded axial hole on its distal face; in that the head of said screw is arranged inside the second chamber and its shank is arranged passing axially through said hole formed in the partition and through the duct of said first spacing sleeve so as to then engage with its free threaded end inside the threaded hole of the field sensor.

3. The system according to claim 2, wherein a second screening sleeve is further provided around said first spacing sleeve.

4. The system according to claim 2, wherein a spacing washer made of insulating material is arranged between the head of the screw and the partition.

5. The system according to claim 2, wherein a support plate is arranged between the head of the screw and the partition, extending radially from said screw and in that said support plate is intended to house the signal conditioning circuit.

6. The system according to claim 5, wherein a spacing washer is arranged between the partition and said support plate.

7. The system according to claim 2, wherein said screw acts as a conductor for the connection between said field sensor and the conditioning circuit.

8. The system according to claim 2, wherein said support plate acts as a conductor for the connection between said field sensor and the conditioning circuit.

9. The system according to claim 2, wherein said screening element comprises a first tube-like element, a second element in the form of an overturned cup and a third cover-like element, the bottom of said second cup element performing the function of the partition.

10. The system according to claim 2, wherein the axes of said hole, said screw and said first spacing sleeve are arranged coaxial with the axis of the sensor.

11. The system according to claim 1, wherein said spacing member comprises a first spacing sleeve which is made of insulating material and comprises a flange, a shank and an axial duct, and a second spacing sleeve which is made of conductive material and comprises an axial duct; in that said first spacing sleeve is positioned with the axis of the axial duct arranged coaxial with the axis of said hole and with the shank directed towards the distal portion, in that said second spacing sleeve is fitted externally around said first spacing sleeve with the distal face of said second spacing sleeve intended to mate with the proximal face of the partition; in that said first spacing sleeve has in the vicinity of its flange a distal face in the form of a circular rim intended to make mating contact with the proximal face of the second spacing sleeve; in that the electric field sensor is arranged with its distal face intended to mate with the proximal face of the first spacing sleeve; in that said field sensor is provided on its proximal face with a threaded axial hole; in that the head of said screw is arranged inside the second chamber and its shank is arranged passing axially through said hole formed in the partition and through the duct of said first spacing sleeve so as to then engage with its free threaded end inside the threaded hole of the field sensor.

12. The system according to claim 11, wherein a spacing washer made of insulating material is arranged between the head of the screw and the partition.

13. The system according to claim 11, wherein a support plate is arranged between the head of the screw and the partition; extending radially from said screw and in that said support plate is intended to house the signal conditioning circuit.

14. The system according to claim 13, wherein a spacing washer is arranged between the partition and said support plate.

15. The system according to claim 11, wherein said screw acts as a conductor for the connection between said field sensor and the conditioning circuit.

16. The system according to claim 11, wherein said support plate acts as a conductor for the connection between said field sensor and the conditioning circuit.

17. The system according to claim 11, wherein said screening element comprises a first tube-like element, a second element in the form of an overturned cup and a third cover-like element, the bottom of said second cup element performing the function of the partition.

* * * * *